(12) United States Patent
Amano et al.

(10) Patent No.: US 10,937,681 B2
(45) Date of Patent: Mar. 2, 2021

(54) WAFER SUPPORT SYSTEM, WAFER SUPPORT DEVICE, SYSTEM COMPRISING A WAFER AND A WAFER SUPPORT DEVICE AS WELL AS MASK ALIGNER

(71) Applicant: SUSS MicroTec Lithography GmbH, Garching bei Muenchen (DE)

(72) Inventors: Yasuaki Amano, Munich (DE); Sven Hansen, Munich (DE); Lennert Schwart, Munich (DE)

(73) Assignee: SUSS MICROTEC LITHOGRAPHY GMBH

(*) Notice: Subject to any disclaimer, the term of this patent is extended or adjusted under 35 U.S.C. 154(b) by 150 days.

(21) Appl. No.: 16/141,720

(22) Filed: Sep. 25, 2018

(65) Prior Publication Data

US 2019/0096733 A1 Mar. 28, 2019

(30) Foreign Application Priority Data

Sep. 25, 2017 (NL) .................................... 2019623

(51) Int. Cl.
| | |
|---|---|
| *H01L 21/68* | (2006.01) |
| *H01L 21/683* | (2006.01) |
| *H01L 21/687* | (2006.01) |
| *G03F 7/20* | (2006.01) |
| *B25B 11/00* | (2006.01) |

(52) U.S. Cl.
CPC ........ *H01L 21/6838* (2013.01); *B25B 11/005* (2013.01); *G03F 7/2014* (2013.01); *G03F 7/707* (2013.01); *G03F 7/7035* (2013.01); *H01L 21/682* (2013.01); *H01L 21/68728* (2013.01); *H01L 21/68735* (2013.01); *H01L 21/6836* (2013.01); *H01L 2221/68327* (2013.01)

(58) Field of Classification Search
CPC .... B25B 11/00; B25B 11/005; H01L 21/6838
See application file for complete search history.

(56) References Cited

U.S. PATENT DOCUMENTS

| | | | |
|---|---|---|---|
| 6,176,008 B1 * | 1/2001 | Ueoka .................. | B23K 3/0623 29/743 |
| 2007/0035717 A1 | 2/2007 | Wu et al. ........................ | 355/78 |
| 2009/0249604 A1 | 10/2009 | Nakamura .................... | 29/426.4 |

(Continued)

OTHER PUBLICATIONS

Netherlands Search Report (w/translation) issued in application No. 2019623, dated Jul. 27, 2018 (9 pgs).

*Primary Examiner* — Lee D Wilson
(74) *Attorney, Agent, or Firm* — Hayes Soloway P.C.

(57) ABSTRACT

A wafer support system has a wafer support device and a dicing frame, wherein the wafer support device has a bottom plate and a top plate. The top plate has a support surface for supporting the wafer, and the bottom plate has a maximum diameter being larger than the maximum diameter of the top plate so that the bottom plate forms a repository for the dicing frame. The dicing frame has a plate-like shape defining a center hole, wherein the minimum diameter of the center hole is larger than the maximum diameter of the top plate so that the dicing frame sinks below the upper surface of the wafer and/or the support surface. Further, a wafer support device, a wafer support system and a mask aligner are provided.

20 Claims, 4 Drawing Sheets

(56) References Cited

U.S. PATENT DOCUMENTS

| | | | |
|---|---|---|---|
| 2012/0315191 A1* | 12/2012 | Maekawa | B01L 3/502715 422/82.08 |
| 2014/0109941 A1 | 4/2014 | Miyanari | H01L 21/6838 |
| 2016/0152507 A1* | 6/2016 | Brown | C03B 33/04 65/53 |
| 2019/0096733 A1* | 3/2019 | Amano | B25B 11/005 |

* cited by examiner

WAFER SUPPORT SYSTEM, WAFER SUPPORT DEVICE, SYSTEM COMPRISING A WAFER AND A WAFER SUPPORT DEVICE AS WELL AS MASK ALIGNER

FIELD OF THE DISCLOSURE

The disclosure relates to a wafer support system, a wafer support device, a system comprising a wafer and a wafer support device as well as a mask aligner comprising a mask holder and a wafer support system.

BACKGROUND

During micro- and nanofabrication of semiconductor elements or the like, very thin substrates like wafers are used. It is known to use a dicing frame and dicing tape for handling and dicing the thin substrates.

Dicing frames are rigid, plate-like structures with a center hole. The substrate or a wafer is fixed within the center hole using a layer of dicing tape spanning across at least parts of the center hole, preferably across the entire center hole.

Usually, the thickness of the dicing frame itself is larger than the thickness of the substrate by at least one order of magnitude. For instance, the wafer has a thickness of 25 to 100 µm and the frame has a thickness of 1 to 2 mm.

This difference in thicknesses causes problems during the processing of the substrate, especially in mask aligners, where only small or no gaps between a mask and the substrate are feasible, for instance, in shadow imaging. When approaching the mask to the substrate or wafer, which is usually supported by a chuck, the mask comes in contact with the dicing frame before the gap is small enough, i.e. before the desired size of the gap is achieved.

SUMMARY

Thus, there is a need to provide a wafer support system, a wafer support device, a system comprising a wafer and a wafer support device, and a mask aligner that allow small or no gaps between a mask and the substrate even if the substrate is mounted in a dicing frame.

For this purpose, a wafer support system for supporting a wafer comprising a wafer support device and a dicing frame is provided, wherein the wafer support device has a bottom plate and a top plate arranged concentrically to each other, wherein the top plate comprises a support surface for supporting the wafer being the surface of the top plate facing away from the bottom plate. The bottom plate has a maximum diameter being larger than the maximum diameter of the top plate so that the bottom plate comprises a shoulder around the top plate forming a repository for the dicing frame. The dicing frame has a plate-like shape defining a center hole, wherein the minimum diameter of the center hole is larger than the maximum diameter of the top plate and the top plate is shaped such that it can extend through the center hole of the dicing frame so that the dicing frame lies in the repository, wherein the highest point of the dicing frame lies below the upper surface of the wafer and/or the support surface in a vertical direction when the wafer is mounted in the dicing frame and placed on top of the wafer support device. Thus, the highest point of the system is then the surface of the wafer allowing for processing steps, especially exposure steps, where the mask should be in close proximity or in contact to the upper surface of the wafer.

In particular, the highest point of the dicing frame lies below the plane of the upper surface of the wafer.

The maximum diameter of the dicing frame may be larger than the maximum diameter of the bottom plate.

The wafer is placed on the top plate concentrically with the top plate so that the dicing frame has no contact with the top plate and may fall towards the bottom plate.

The object is further achieved by a wafer support device for supporting a wafer mounted in a dicing frame comprising a bottom plate and a top plate arranged concentrically to each other, wherein the top plate has a support surface for supporting the wafer being the surface of the top plate facing away from the bottom plate. The bottom plate has a maximum diameter being larger than the maximum diameter of the top plate so that the bottom plate comprises a shoulder around the top plate forming a repository for the dicing frame so that the dicing frame lies in the repository, wherein the highest point of the dicing frame lies below the upper surface of the wafer and/or the support surface in a vertical direction when the wafer is mounted in the dicing frame and placed on top of the wafer support device. The wafer support device may be a chuck. By providing the shoulder and a repository for the dicing frame, the dicing frame may sink completely below the wafer, more precisely below the upper surface of the wafer in a vertical direction.

The disclosure further relates to a system comprising a wafer and a wafer support device having a bottom plate and a top plate arranged concentrically to each other, wherein the top plate comprises a support surface for supporting the wafer being the surface of the top plate facing away from the bottom plate, the support surface having the same dimensions as the wafer. The bottom plate has a maximum diameter being larger than the maximum diameter of the top plate so that the bottom plate comprises a shoulder around the top plate forming a repository for the dicing frame so that the dicing frame lies in the repository, wherein the highest point of the dicing frame lies below the upper surface of the wafer and/or the support surface in a vertical direction when the wafer is mounted in the dicing frame and placed on top of the wafer support device.

Preferably, the support surface has the same dimensions as the wafer. For example, for 200 mm chucks, the diameter of the top plate is also 200 mm.

Further, the disclosure contemplates a system comprising a dicing frame, a wafer mounted in the dicing frame and a wafer support device, wherein the wafer support device has a bottom plate and a top plate arranged concentrically to each other. The top plate comprises a support surface for supporting the wafer being the surface of the top plate facing away from the bottom plate, the support surface having the same dimensions as the wafer. The bottom plate has a maximum diameter being larger than the maximum diameter of the top plate so that the bottom plate comprises a shoulder around the top plate forming a repository for the dicing frame. The dicing frame has a plate-like shape defining a center hole and the dicing frame is located above the support surface, wherein the minimum diameter of the center hole is larger than the maximum diameter of the top plate. The wafer is located at the support surface and is mounted in the dicing frame using dicing tape, and the top plate extends through the center hole of the dicing frame so that the dicing frame lies in the repository, wherein the highest point of the dicing frame lies below the upper surface of the wafer and/or the support surface in a vertical direction when the wafer is mounted in the dicing frame and placed on top of the wafer support device.

In particular, the bottom plate and the top plate may be attached to each other. Thus, the bottom plate and the top plate may be separate elements that have been attached to one other.

The bottom plate and/or the top plate may be flat.

For example, the maximum diameter of the bottom plate is at least 1.3 times the maximum diameter of the top plate to provide a stable and sufficiently sized repository.

In an embodiment of the disclosure, the support surface is provided with at least one outer vacuum zone and at least one inner vacuum zone, the at least one outer vacuum zone and the at least one inner vacuum zone being fluidically separate from each other, wherein the at least one outer vacuum zone is located at the outer edge of the support surface. The vacuum zones may comprise grooves, porous surfaces or other suction means. By providing an outer and an inner vacuum zone, it is possible to securely fix the wafer to the substrate while avoiding bending the substrate in the middle. This can be achieved by activating both vacuum zones during mounting and deactivating the inner vacuum zone once the wafer is securely fixed to the support surface.

For example, the at least one outer vacuum zone extends along at least three-quarters of the periphery, in particular along the entire periphery of the top plate. This way, secure fixation of the wafer can be assured, even if only the outer vacuum zone is actuated.

In the radial direction, only one outer vacuum zone may be provided to reduce bending to a minimum.

Preferably, the wafer support device comprises a first supply duct and a second supply duct being fluidly connected to the at least one outer vacuum zone and the at least one inner vacuum zone, respectively, and ending in a first vacuum port and a second vacuum port, respectively. The first supply duct and the second supply duct extend through the top plate and the bottom plate. Therefore, vacuum can be applied to the vacuum zones with simple and reliable measures.

The supply ducts may extend radially outwards in the bottom plate, in particular in opposite directions, and towards the periphery of the bottom plate.

For example, a first vacuum port and a second vacuum port are provided at the periphery of the bottom plate, wherein the first supply duct and the second supply duct end at the first vacuum port and the second vacuum port, respectively.

Several inner vacuum zones may be provided forming concentric circles interconnected by radially extending spines to securely fix the wafer to the wafer support.

In another embodiment, the top plate is made of a transparent material and the bottom plate is made of an opaque material, the bottom plate having at least one cut-out in the region covered by the top plate. Preferably the bottom plate has two opposite cut-outs for back-side alignment. The cut-out and the use of the transparent material allow for using alignment marks on the bottom side of the wafer that can be used for optical alignment of the wafer.

For achieving long lifetimes and duty cycles, the top plate is made of glass and/or the bottom plate is made of plastic or metal, in particular steel or aluminum.

Two cut-outs may be provided, being located diametrically opposed to each other with respect to the top plate to allow for different alignment positions of the wafer.

In order to avoid vibrations or undesired movements of the dicing frame, the wafer support device comprises at least one protrusion extending from the shoulder of the bottom plate on the same side as the top plate for aligning and/or supporting the dicing frame.

The protrusion may be a magnetic element for fixing the dicing frame to the shoulder.

Pre-adjustment of the substrate to the stage can be done trough a notch that may be provided in the outer periphery of the dicing frame.

The disclosure further provides a mask aligner for aligning a mask and a wafer comprising a mask holder and a wafer support system according to the disclosure. As explained above, the mask aligner can be used for processing wafers mounted in a dicing frame to expose the substrate or a coating thereon with small gaps between the mask and the wafer or even no gap at all.

In an embodiment of the disclosure, a proximity spacer and an actuator are provided at the mask holder. The actuator is configured to move the proximity spacer between an active position and an inactive position, wherein the proximity spacer is located radially outside of the region of the dicing frame in the inactive position. Thus, the mask aligner can be used even if no proximity spacer is needed for this specific task.

DESCRIPTION OF THE DRAWINGS

Further features and advantages of the disclosure will be apparent from the following description of the embodiments and the attached drawings to which reference is made. In the drawings.

DETAILED DESCRIPTION

Figure 1:
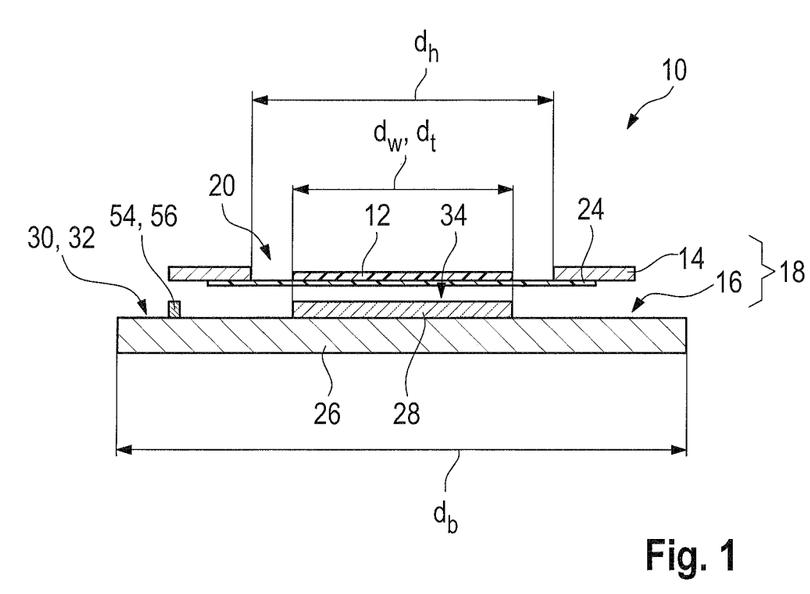
FIG. 1 shows schematically a sectional view along axis I-I of a system according to the disclosure with a wafer support system according to the disclosure and a wafer support device according to the disclosure.
Figure 2:
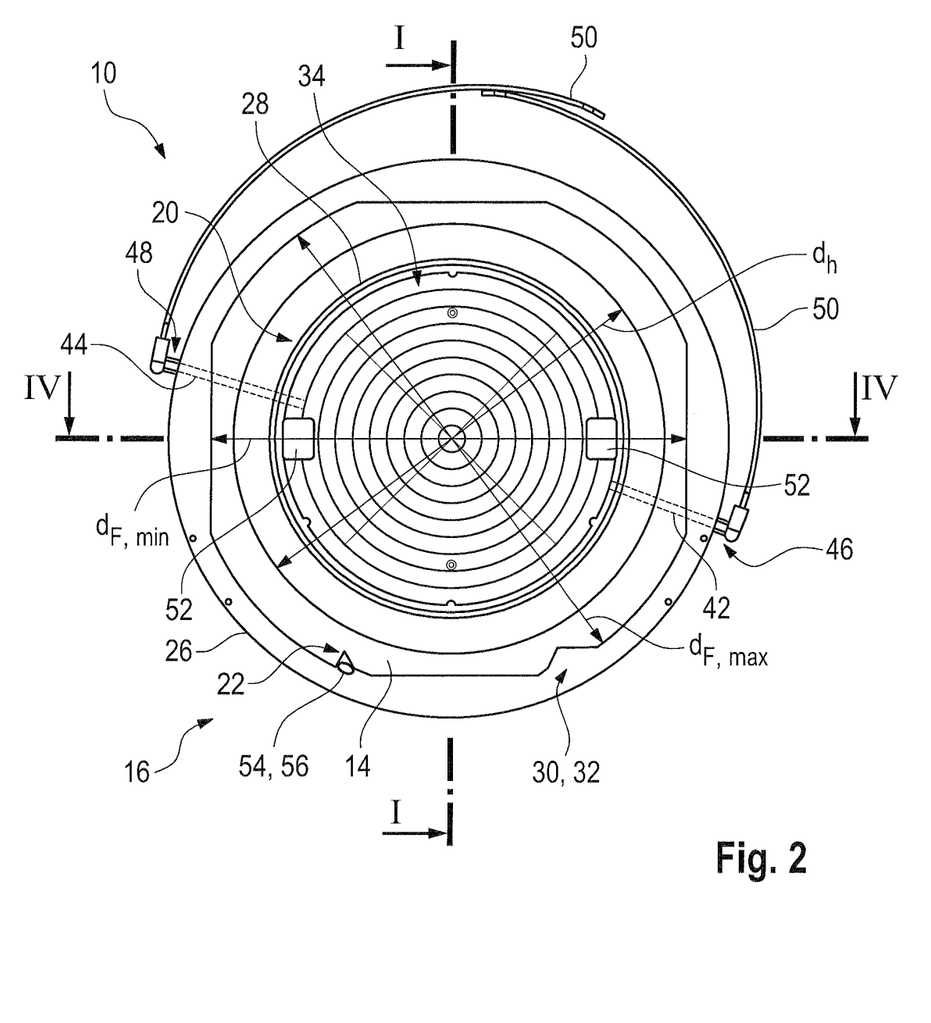
FIG. 2 shows a top view of the system according to FIG. 1.

FIGS. 1 and 2 show a system 10 for supporting a wafer 12. In FIG. 2, the wafer 12 and dicing tape are not shown for the sake of simplicity.

The wafer 12 may be a thin wafer made of silicon. However, in the sense of the described disclosure, the term "wafer" may also comprise other substrates like glass, III-V materials, sapphire or the like.

The wafer 12 may have standard sizes with a diameter $d_w$ of 125 mm, 150 mm, 200 mm or 300 mm.

The system 10 comprises a wafer 12, a dicing frame 14 and a wafer support device 16. The dicing frame 14 and the wafer support device 16 may be seen as a wafer support system 18.

For the sake of clarity, the wafer support device 16 is shown separately from the wafer 12 and the dicing frame 14.

The dicing frame 14 is a rigid structure with a plate-like shape surrounding a center hole 20 as can be seen in FIG. 2.

The thickness of the dicing frame 14 may be larger than the thickness of the wafer 12 by an order of magnitude.

In the shown embodiment, the center hole 20 has a circular shape and a diameter that is in this case also the minimum diameter $d_h$ of the center hole 20.

For example, the outer contour of the dicing frame 14 is not circular but has a maximum diameter $d_{F,max}$ and a minimum diameter $d_{F,min}$.

The dicing frame 14 further comprises at least one notch 22 at its outer periphery.

The wafer 12 is mounted in the center hole 20 of the dicing frame 14 using dicing tape 24.

The dicing tape 24 is sheet-like and fixed at the bottom side of the dicing frame 14. It spans across parts of or across the entire center hole 20. The dicing tape 24 is flexible and may be even elastic.

The wafer 12 is placed with its bottom side onto the dicing tape 24 within the center hole 20. This way, wafer 12 is mounted in the dicing frame 14.

The wafer support device 16 has a bottom plate 26 and a top plate 28 that are attached to each other.

The wafer support device 16 may be a chuck that may be mounted onto a wedge error compensation head (not shown) via the bottom plate 26, for example.

The top plate 28 is attached to the upper surface of the bottom plate 26.

Directional terms like "upper", "bottom" or the like are used in reference to the designated mounting position of the wafer 12 and the whole system 10. Thus, the upward direction extends in the opposite direction as the direction of the gravitational force.

In the shown embodiment, the top plate 28 and the bottom plate 26 have a circular shape and are concentrically to each other. It is of course possible that the bottom plate 26 and the top plate 28 have any other shape.

The shape of the top plate 28 corresponds exactly to the shape of the wafer 12, meaning that the diameter $d_t$ of the top plate 28 and the diameter $d_w$ of the wafer 12 are identical.

Further, the diameter $d_t$ of the top plate 28 is smaller than the minimum diameter $d_h$ of the center hole 20 so that the top plate 28 may fit through the center hole 20.

Compared with the bottom plate 26, the maximum diameter $d_t$ of the top plate 28 is smaller than the maximum diameter $d_b$ of the bottom plate 26. The maximum diameter $d_b$ of the bottom plate 26 is, for example, at least 1.3 times the maximum diameter $d_t$ of the top plate 28.

In other words, the bottom plate 26 is larger than the top plate 28. Thus, the bottom plate 26 extends further in the radial direction than the top plate 28. The section of the bottom plate 26 extending further than the top plate 28 forms a shoulder 30 around the top plate 28. The shoulder 30 is a repository 32 for the dicing frame 14.

The top plate 28 has an upper surface facing away from the bottom plate 26. This surface is a support surface 34 for the wafer 12. The support surface 34 is shown enlarged in FIG. 3.

Figure 3:
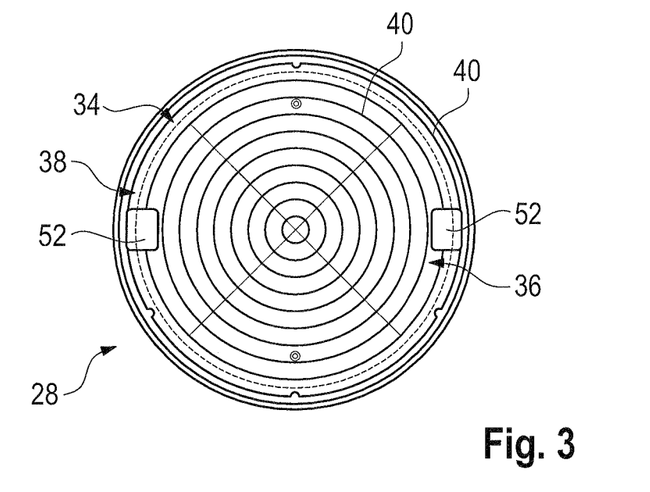
FIG. 3 shows part of an enlarged view of the top view of FIG. 2.

The support surface 34 comprises vacuum means for creating low pressure below the wafer 12 to fix the wafer 12 to the wafer support device 16 though suction.

For this purpose, the support surface 34 has an inner vacuum zone 36 and an outer vacuum zone 38 with respect to the radial direction of the support surface 34.

In FIG. 3, the inner vacuum zone 36 and the outer vacuum zone 38 are delimited by a dashed circle.

The vacuum zones 36, 38 may be provided by vacuum grooves 40 in the support surface 34.

It is also possible that the vacuum zones 36, 38 are provided by a section of porous surface of the support surface 34 or other suction devices.

In the shown embodiment, the outer vacuum zone 38 surrounds the inner vacuum zone 36 completely and the vacuum zones 36, 38 are fluidically separate from each other.

The outer vacuum zone 38 includes the outer edge of the support surface and extends along the entire periphery of the top plate 28.

Further, in the radial direction, only one vacuum groove 40 in the outer vacuum zone 38 is provided.

The inner vacuum zone 36 has several inner vacuum grooves 40 forming concentric circles that are interconnected by further vacuum grooves 40 forming radial spines.

The vacuum is supplied to the vacuum zones 36, 38, i.e. air is sucked out of the vacuum zones 36, 38, via a first supply duct 42 and a second supply duct 44. The first supply duct 42 and the second supply duct 44 are fluidically connected to the outer vacuum zone 38 and the inner vacuum zone 36, respectively.

In the shown embodiment, the supply ducts 42, 44 run through the top plate 28 into the bottom plate 26.

In the bottom plate 26, the supply ducts 42, 44 extend radially outwards in opposite directions and towards the periphery of the bottom plate 26.

At the periphery of the bottom plate 26, a first vacuum port 46 and a second vacuum port 48 are provided, wherein the first supply duct 42 and the second supply duct 44 end at the first vacuum port 46 and the second vacuum port 48, respectively.

The vacuum ports 46, 48 are arranged diametrically opposed to each other at the periphery of the bottom plate 26.

The vacuum ports 46, 48 may be connected to a suitable vacuum source (not shown) via tubes 50 or the like.

In another embodiment, the vacuum ports 46, 48 can be arranged on the bottom of the bottom plate 26. In this case the bottom plate can be mounted on a larger stage which has compatible ports for connecting to the vacuum ports 46, 48, for example, via O-rings.

The top plate 28 may be made of a transparent material, like glass, and the bottom plate 26 may be made of an opaque material, like plastic or metal, in particular steel or aluminum.

Figure 4:
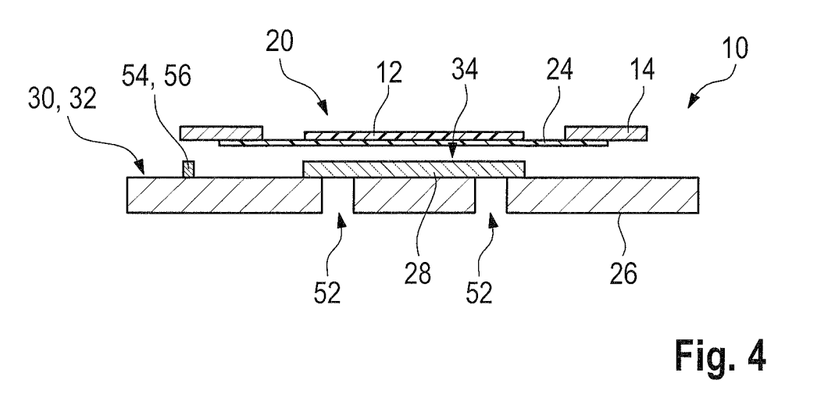
FIG. 4 shows a sectional view of the system of FIG. 1 along the axis IV-IV in FIG. 2.

In this embodiment, the bottom plate 26 has two cut-outs below the top plate 28 that extend through the entire thickness of the bottom plate 26, as may be seen in FIG. 4.

The cut-outs 52 are located diametrically opposed to each other with respect to the center of the bottom plate 26.

Further, the cut-outs 52 may be located in a section of the bottom plate 26 that corresponds to a section close to the edge of the top plate 28 below the top plate 28.

More precisely, this section may extend from the edge of the top plate 28 radially inwards for about one quarter, in particular about one sixth of the diameter $d_t$ of the top plate 28.

Further, the bottom plate 26 may comprise a protrusion 54 located at the top side of the shoulder 30, i.e. on the same side as the top plate 28. The protrusion 54 extends from the shoulder 30 upwards.

In the embodiment shown in FIG. 1, the protrusion 54 is an alignment pin 56 that is designed to engage with the notch 22 of the dicing frame 14 when the dicing frame 14 and the wafer 12 are mounted on the wafer support system 18.

For mounting the wafer 12 to the wafer support system 18, the dicing frame 14 with the wafer 12 is placed above the wafer support device 16 so that the wafer 12 and the top plate 28 are concentric to each other. Then, the wafer 12 is lowered towards the wafer support device 16.

While lowering the dicing frame 14, the wafer 12—more precisely the dicing tape 24—comes in contact with the support surface 34 of the top plate 28.

Applying vacuum in both vacuum zones 36 and 38 aids this process and fixes the wafer 12 and the dicing tape 24 to the top plate 28.

Once the wafer 12 is fixed on the support surface 34, the inner vacuum zones 36 may be deactivated to avoid bending of the wafer 12.

The dicing frame 14 is then above the shoulder 30 of the bottom plate 26.

In the shown embodiment, the maximum diameter $d_{F,max}$ of the dicing frame 14 is smaller than the diameter $d_b$ of the bottom plate 26 so that the dicing frame 14 lies completely within the radial boundaries of the shoulder 30 and within the repository 32. It is not necessary for the dicing frame 14 to physically contact the shoulder 30 in order to be within the repository 32.

When the dicing frame 14 is released from the end-effector used for mounting, the dicing frame 14 is held solely by the dicing tape 24. The dicing tape 24 is, however, flexible so that it cannot support the weight of the dicing frame 14. Thus, the dicing frame 14 sinks down towards the bottom plate 26 due to gravity.

The dicing frame 14 sinks so low, that its highest point lies below the plane P (FIG. 5) of the upper surface of the wafer 12. Thus, the highest point of the system 10 is then the surface of the wafer 12 allowing for processing steps, especially exposure steps, where the mask should be in close proximity or in contact to the upper surface of the wafer 12.

Figure 5:
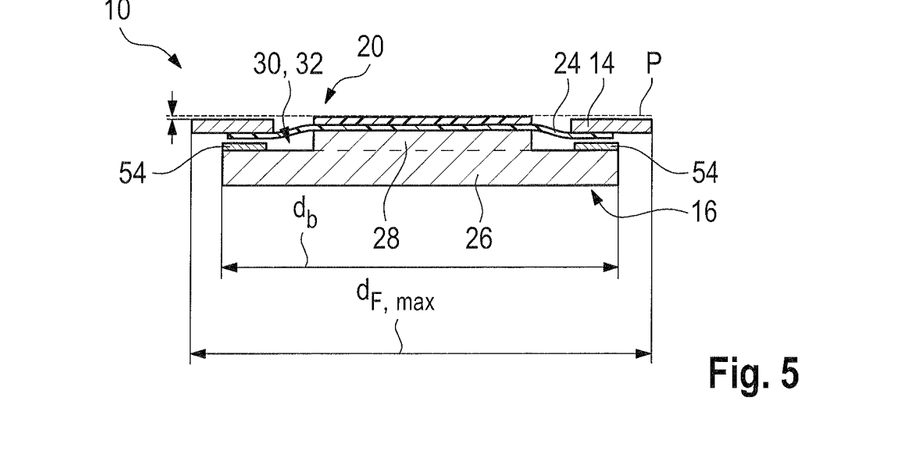
FIG. 5 shows schematically a second embodiment of the system according to the disclosure with a second embodiment of the wafer support system and a second embodiment of the wafer support device.

FIG. 5 shows a second embodiment of the system 10. The second embodiment of the system 10 corresponds mostly to the first embodiment shown in FIGS. 1 to 4. Thus, only the differences are explained in the following and the same or functionally same parts are labeled with the same numbers.

In the second embodiment of the system 10 shown in FIG. 5, the wafer support device 16 is made of one piece. The top plate 28 and the bottom plate 26 are made of the same material, in the shown case an opaque material.

Of course, it is also possible that a transparent material for the whole wafer support device 16 is used.

Further, the maximum diameter of the dicing frame $d_{F,max}$ is larger than the maximum diameter $d_b$ of the bottom plate 26. Still, the dicing frame 14 rests at least partially in the repository 32 above the shoulder 30 of the bottom plate 26.

Further, the protrusion 54 is a magnetic element that fixes the dicing frame 14 to the shoulder 30 by magnetic force. This way, unwanted vibrations of the dicing frame 14 may be eliminated.

The fixing may be done by direct contact between the dicing frame 14 and the protrusion 54 or solely through magnetic forces without contact.

Figure 6:
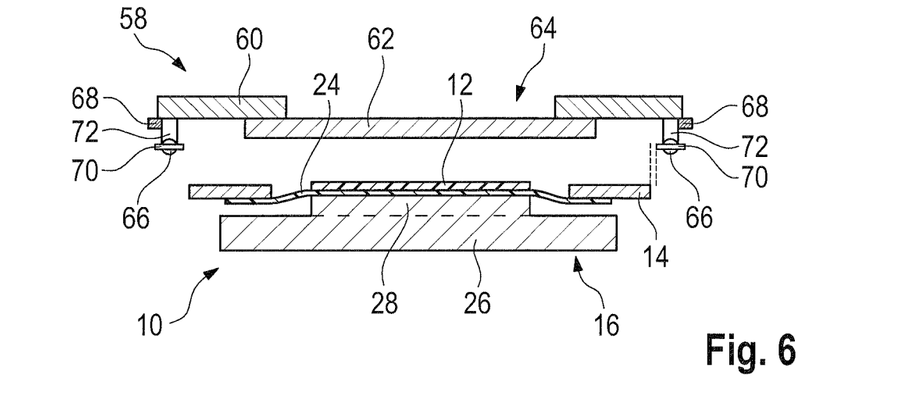
FIG. 6 shows schematically a mask aligner according to the disclosure with a wafer support system according to FIG. 5.
Figure 7:
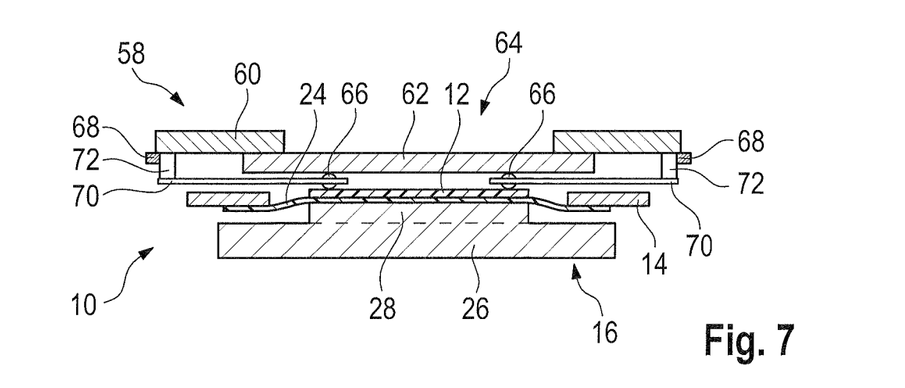
FIG. 7 shows the mask aligner of FIG. 6 with proximity spacers in a different position.

FIGS. 6 and 7 show schematic sectional views of a mask aligner 58.

The mask aligner 58 comprises a mask holder 60 and a mask 62 as well as the system 10 comprising the wafer 12, the dicing frame 14, and the wafer support device 16.

The mask holder 60 is a rigid structure with an exposure opening 64 that is covered by the mask 62. The mask 62 is fixed to the bottom side of the mask holder 60, for example by vacuum, and closes the exposure opening 64 partially or entirely.

Further, the mask holder 60 of the shown example comprises at least three proximity spacers 66 and at least three actuators 68 for moving each of the proximity spacers 66.

The proximity spacers 66 are ceramic balls, for example with a diameter of 2.000 μm.

The proximity spacers 66 are held by supporting arms 70 extending parallel to the exposure opening 64.

The supporting arms 70 are mounted on rods 72 rotatably fixed to the mask holder 60.

The rods 72 may be rotated with respect to their vertical axis by the actuators 68 in order to move the proximity spacers 66 between an active position and an inactive position.

FIG. 6 shows the proximity spacers 66 in their inactive position in which they lie radially outwards of the region of the dicing frame 14. This way, when the mask 62 and the wafer 12 shall contact each other for exposure, the proximity spacers 66 do not come in contact with the dicing frame 14.

FIG. 7 shows the proximity spacers 66 in their active position. In the active position, the proximity spacers 66 lie radially within the region of the top plate 28 and the wafer 12.

The mask 62 and the mask holder 60 may then be lowered until both the wafer 12 and the mask 62 contact the proximity spacers 66 from opposite sides. This way, a predefined gap may be achieved between the mask 62 and the wafer 12.

The features of the shown embodiments may of course be used in different combinations than the ones shown in the exemplary embodiments. For example, the protrusions 54 in the first embodiment may also be magnetic elements.

The invention claimed is:

1. A wafer support system for supporting a wafer comprising a wafer support device and a dicing frame,
   wherein the wafer support device has a bottom plate and a top plate arranged concentrically to each other,
   wherein the top plate comprises a support surface configured for supporting the wafer being the surface of the top plate facing away from the bottom plate,
   wherein the bottom plate has a maximum diameter being larger than the maximum diameter of the top plate so that the bottom plate comprises a shoulder around the top plate forming a repository for the dicing frame,
   wherein the top plate is made of a transparent material and the bottom plate is made of an opaque material, the bottom plate having at least one cut-out in the region covered by the top plate,
   wherein the dicing frame has a plate shape defining a center hole,
   wherein the minimum diameter of the center hole is larger than the maximum diameter of the top plate,
   wherein the top plate is shaped such that the top plate can extend through the center hole of the dicing frame so that the dicing frame lies in the repository, wherein the highest point of the dicing frame lies below at least one of the upper surface of the wafer and the support surface in a vertical direction when the wafer is mounted in the dicing frame and placed on top of the wafer support device, and
   wherein the support surface comprises vacuum grooves or sections of porous surfaces configured for fixing a wafer to the support surface via suction.

2. A wafer support device for supporting a wafer mounted in a dicing frame comprising a bottom plate and a top plate arranged concentrically to each other,
   wherein the top plate comprises a support surface configured for supporting the wafer being the surface of the top plate facing away from the bottom plate, wherein the bottom plate has a maximum diameter being larger than the maximum diameter of the top plate so that the bottom plate comprises a shoulder around the top plate forming a repository for the dicing frame so that the dicing frame lies in the repository, wherein the highest point of the dicing frame lies below at least one of the upper surface of the wafer and the support surface in a vertical direction when the wafer is mounted in the dicing frame and placed on top of the wafer support device, wherein the top plate is made of a transparent material and the bottom plate is made of an opaque material, the bottom plate having at least one cut-out in the region covered by the top plate, and wherein the support surface comprises vacuum grooves or sections of porous surfaces configured for fixing a wafer to the support surface via suction.

3. The wafer support system according to claim 1, wherein the support surface has the same dimensions as the wafer.

4. The wafer support system according to claim 1, wherein the maximum diameter of the bottom plate is at least 1.3 times the maximum diameter of the top plate.

5. The wafer support system according to claim 1, wherein the support surface is provided with at least one outer vacuum zone and at least one inner vacuum zone, the at least one outer vacuum zone and the at least one inner vacuum zone being fluidically separate from each other, wherein the at least one outer vacuum zone is located at the outer edge of the support surface.

6. The wafer support system according to claim 5, wherein the at least one outer vacuum zone extends along at least three-quarters of the periphery.

7. The wafer support system according to claim 6, wherein the at least one outer vacuum zone extends along the entire periphery of the top plate.

8. The wafer support system according to claim 5, wherein the wafer support device comprises a first supply duct and a second supply duct being fluidly connected to the at least one outer vacuum zone and the at least one inner vacuum zone, respectively, and ending in a first vacuum port and a second vacuum port, respectively, and wherein the first supply duct and the second supply duct extend through the bottom plate.

9. The wafer support system according to claim 1, wherein at least one of the top plate is made of glass and the bottom plate is made of plastic or metal.

10. The wafer support system according to claim 1, wherein the wafer support device comprises at least one protrusion extending from the shoulder of the bottom plate on the same side as the top plate for at least one of aligning and supporting the dicing frame.

11. A mask aligner for aligning a mask and a wafer comprising a mask holder and a wafer support system for supporting a wafer comprising a wafer support device and a dicing frame,
    wherein the wafer support device has a bottom plate and a top plate arranged concentrically to each other,
    wherein the top plate comprises a support surface configured for supporting the wafer being the surface of the top plate facing away from the bottom plate,
    wherein the bottom plate has a maximum diameter being larger than the maximum diameter of the top plate so that the bottom plate comprises a shoulder around the top plate forming a repository for the dicing frame,
    wherein the top plate is made of a transparent material and the bottom plate is made of an opaque material, the bottom plate having at least one cut-out in the region covered by the top plate,
    wherein the dicing frame has a plate shape defining a center hole,
    wherein the minimum diameter of the center hole is larger than the maximum diameter of the top plate,
    wherein the top plate is shaped such that the top plate can extend through the center hole of the dicing frame so that the dicing frame lies in the repository, wherein the highest point of the dicing frame lies below at least one of the upper surface of the wafer and the support surface in a vertical direction when the wafer is mounted in the dicing frame and placed on top of the wafer support device, and
    wherein the support surface comprises vacuum grooves or sections of porous surfaces configured for fixing a wafer to the support surface via suction.

12. The mask aligner according to claim 11, wherein at least one proximity spacer and an actuator are provided at the mask holder,
    wherein the actuator is configured to move the proximity spacer between an active position and an inactive position,
wherein the proximity spacer is located radially outside of the region of the dicing frame in the inactive position.

13. The wafer support device of claim 2, wherein the support surface has the same dimensions as the wafer.

14. The wafer support device according to claim 2, wherein the maximum diameter of the bottom plate is at least 1.3 times the maximum diameter of the top plate.

15. The wafer support device according to claim 2, wherein the support surface is provided with at least one outer vacuum zone and at least one inner vacuum zone, the at least one outer vacuum zone and the at least one inner vacuum zone being fluidically separate from each other, wherein the at least one outer vacuum zone is located at the outer edge of the support surface.

16. The wafer support device according to claim 15, wherein the at least one outer vacuum zone extends along at least three-quarters of the periphery.

17. The wafer support device according to claim 16, wherein the at least one outer vacuum zone extends along the entire periphery of the top plate.

18. The wafer support device according to claim 15, wherein the wafer support device comprises a first supply duct and a second supply duct being fluidly connected to the at least one outer vacuum zone and the at least one inner vacuum zone, respectively, and ending in a first vacuum port and a second vacuum port, respectively, wherein the first supply duct and the second supply duct extend through the bottom plate.

19. The wafer support device according to claim 2, wherein at least one of the top plate is made of glass and the bottom plate is made of plastic or metal.

20. The wafer support device according to claim 2, wherein the wafer support device comprises at least one protrusion extending from the shoulder of the bottom plate on the same side as the top plate for at least one of aligning and supporting the dicing frame.

* * * * *